United States Patent [19]

Barnett et al.

[11] Patent Number: 4,743,970
[45] Date of Patent: May 10, 1988

[54] PICTURE TRANSFORMATION MEMORY

[75] Inventors: Ronnie D. Barnett; Richard A. Jackson, both of Nevada City,, Calif.

[73] Assignee: The Grass Valley Group, Inc., Grass Valley, Calif.

[21] Appl. No.: 920,560

[22] Filed: Oct. 20, 1986

[51] Int. Cl.$^4$ ............................................. H04N 5/272
[52] U.S. Cl. .................... 358/183; 358/135; 358/140
[58] Field of Search ............... 358/183, 180, 182, 22, 358/136, 135, 140, 160

[56] References Cited

U.S. PATENT DOCUMENTS

| | | | |
|---|---|---|---|
| 4,322,750 | 3/1982 | Lord et al. | 358/140 |
| 4,432,009 | 2/1984 | Reitmeier et al. | 358/140 X |
| 4,449,143 | 5/1984 | Dischert et al. | 358/140 X |
| 4,463,372 | 7/1984 | Bennett et al. | 358/22 |
| 4,468,747 | 8/1984 | Leavitt et al. | 358/140 X |
| 4,573,070 | 5/1986 | Cooper | 358/37 X |
| 4,587,556 | 5/1986 | Collins | 358/140 |
| 4,639,769 | 1/1987 | Fleisher et al. | 358/22 X |
| 4,665,433 | 5/1987 | Hinson et al. | 358/160 X |
| 4,675,733 | 6/1987 | Tanimoto | 358/136 X |

Primary Examiner—Edward L. Coles, Sr
Assistant Examiner—E. Anne Faris
Attorney, Agent, or Firm—Francis I. Gray

[57] ABSTRACT

A picture transformation memory has three field stores which rotatively store a next field of video data, output a prior field of video data and output a current field of video data to provide a full frame output for each field input period. Each field store has four planes which contain identical fields of data and are read from sequentially pixel by pixel. Each plane has four banks with the field data being read into the banks sequentially pixel by pixel such that when one pixel is addressed, a local address generator addresses the neighboring pixels as well to produce a multi-pixel output to an interpolator. Four half bandwidth data the first and third planes contain identical data and the second and fourth planes contain identical data in the same address locations as the corresponding data in planes one and three. The planes are independently addressable as are the pixels in each plane so that the pixels can be read from the picture transformation memory in a random sequence to accommodate any desired picture transformation.

6 Claims, 6 Drawing Sheets

TRANSFORMATION ADDRESS:

| $Y_2$ | $Y_1$ | $Y_0$ | $X_0$ | 0 | 1 | 0 | 1 | 0 | 1 | 0 | 1 | 0 | 1 | | | |
|---|---|---|---|---|---|---|---|---|---|---|---|---|---|---|---|---|
| 0 | 0 | 0 | | A⊘ | C⊘ | A⊘ | C⊘ | A⊘ | C⊘ | A⊘ | C⊘ | A⊘ | C⊘ | • | • | • FIELD 1 |
| 0 | 0 | 1 | | B○ | D○ | B○ | D○ | B○ | D○ | B○ | D○ | B○ | D○ | • | • | • FIELD 2 |
| 0 | 1 | 0 | | B⊘ | D⊘ | B⊘ | D⊘ | B⊘ | D⊘ | B⊘ | D⊘ | B⊘ | D⊘ | • | • | • FIELD 1 |
| 0 | 1 | 1 | | C○ | A○ | C○ | A○ | C○ | A○ | C○ | A○ | C○ | A○ | • | • | • FIELD 2 |
| 1 | 0 | 0 | | C⊘ | A⊘ | C⊘ | A⊘ | C⊘ | A⊘ | C⊘ | A⊘ | C⊘ | A⊘ | • | • | • ” |
| 1 | 0 | 1 | | D○ | B○ | D○ | B○ | D○ | B○ | D○ | B○ | D○ | B○ | • | • | • ” |
| 1 | 1 | 0 | | D⊘ | B⊘ | D⊘ | B⊘ | D⊘ | B⊘ | D⊘ | B⊘ | D⊘ | B⊘ | • | • | • ” |
| 1 | 1 | 1 | | A○ | C○ | A○ | C○ | A○ | C○ | A○ | C○ | A○ | C○ | • | • | • ” |
| 0 | 0 | 0 | | A⊘ | C⊘ | A⊘ | C⊘ | A⊘ | C⊘ | A⊘ | C⊘ | A⊘ | C⊘ | • | • | • ” |
| 0 | 0 | 1 | | B○ | D○ | B○ | D○ | B○ | D○ | B○ | D○ | B○ | D○ | • | • | • ” |
| 0 | 1 | 0 | | B⊘ | D⊘ | B⊘ | D⊘ | B⊘ | D⊘ | B⊘ | D⊘ | B⊘ | D⊘ | • | • | • FIELD 1 |
| 0 | 1 | 1 | | C○ | A○ | C○ | A○ | C○ | A○ | C○ | A○ | C○ | A○ | • | • | • FIELD 2 |

FIG. 5

TRANSFORMATION ADDRESS:

| $Y_1$ | $Y_0$ | $X_0$ | 0 | 1 | 0 | 1 | 0 | 1 | 0 | 1 | 0 | 1 | | | |
|---|---|---|---|---|---|---|---|---|---|---|---|---|---|---|---|
| 0 | 0 | | A⊘ | C⊘ | A⊘ | C⊘ | A⊘ | C⊘ | A⊘ | C⊘ | A⊘ | C⊘ | • | • • FIELD 1 |
| 0 | 1 | | B⊘ | D⊘ | B⊘ | D⊘ | B⊘ | D⊘ | B⊘ | D⊘ | B⊘ | D⊘ | • | • • FIELD 1 |
| 1 | 0 | | C⊘ | A⊘ | C⊘ | A⊘ | C⊘ | A⊘ | C⊘ | A⊘ | C⊘ | A⊘ | • | • • " |
| 1 | 1 | | D⊘ | B⊘ | D⊘ | B⊘ | D⊘ | B⊘ | D⊘ | B⊘ | D⊘ | B⊘ | • | • • " |
| 0 | 0 | | A⊘ | C⊘ | A⊘ | C⊘ | A⊘ | C⊘ | A⊘ | C⊘ | A⊘ | C⊘ | • | • • " |
| 0 | 1 | | B⊘ | D⊘ | B⊘ | D⊘ | B⊘ | D⊘ | B⊘ | D⊘ | B⊘ | D⊘ | • | • • " |

FIG. 4

| | ODD PLANE | EVEN PLANE | ODD | EVEN | ODD | EVEN | ODD | EVEN | | |
|---|---|---|---|---|---|---|---|---|---|---|
| | $A_0$ | $A_0$ | $C_0$ | $C_0$ | $A_2$ | $A_2$ | $C_2$ | $C_2$ | | |
| LINE EVEN | ⊘ | ○ | ⊘ | ○ | ⊘ | ○ | ⊘ | ○ | • • • |
| | $B_0$ | $B_0$ | $D_0$ | $D_0$ | $B_2$ | $B_2$ | $D_2$ | $D_2$ | | |
| LINE ODD | ⊘ | ○ | ⊘ | ○ | ⊘ | ○ | ⊘ | ○ | • • • |

FIG. 7     ⊘ = U     ○ = V

PICTURE TRANSFORMATION MEMORY

BACKGROUND OF THE INVENTION

The present invention relates to digital memory architectures, and more particular to a picture transformation memory for use with a digital video effects system.

A digital video effects system receives video data, either analog or digital, from various sources, such as cameras, video tapes and discs, etc., via an input section. The video data is converted to a desired digital format in the input section and appropriately filtered according to the effects which are desired at the output of the system. The filtered digital video data is then transformed, i.e., a transform section performs spatial transformations, such as enlargement, reduction, translation and rotation. The digital video data, representing a picture image, is written into a frame buffer in a normal, unchanged way using a first set of addresses generated by an input address generator. An output address generator, sometimes called a reverse or transformation address generator, reads the picture image out of the frame buffer in such a manner as to create the desired transform. An address limit detector senses when a given output address is outside the frame buffer's address range and blanks the video for those addresses. The addresses from the transformation address generator are derived from the original addresses of an output display screen, such as a television monitor, multiplied by a transform matrix T'. Besides the video frame buffer to store the luminance and chrominance components of the picture, a key frame buffer is also operated in parallel to provide shape and transparency information about the picture, the key being transformed in a like manner as the picture. The transformed picture from the frame buffer is mixed with a background picture image in proportion to the key value (between 0 and 1) to produce the final picture image which is displayed.

When transforming an interlaced video picture in a digital video effects system, it is desirable to perform the video processing on a full frame as if the picture image were not interlaced. Such a spatial transformation system is described in U.S. Pat. No. 4,463,372 entitled "Spatial Transformation System Including Key Signal Generator" issued to Phillip P. Bennett and Steven A. Gabriel on July 31, 1984. At FIG. 6 and column 19 of that patent a particular memory architecture is described which uses three full field buffer memories. The input to the three buffer memories is the digitized video picture image to be transformed or otherwise processed by the digital video effects system. The field buffers operate on a continuous revolving basis in that one buffer receives an incoming field of data while the other two buffers, containing the newest complete field of data and the prior complete field of data, provide outputs via a multiplexer which together make up a complete picture frame of data. Thus a field buffer memory on consecutive data fields first receives an input field of data, then outputs the newest complete field of data, and finally outputs the prior complete field of data, the cycle repeating itself every three fields.

Real time television frame stores require significant quantities of semiconductor memory. Since the picture elements (pixels) occur at approximately 70 nanosecond intervals, current practically available memory storage chips which are inexpensive and relatively low in power consumption cannot be accessed at pixel clock rates. To accommodate the required bandwidth the Bennett et al patent implements each field buffer memory as eight modules of 32K×8 memory which are addressed sequentially, i.e., once every eight pixel clock periods. This method, however, requires that the stored data be accessed in a specific order and is not a totally random access frame store.

As indicated there are three channels of data that are transformed in parallel: a luminance channel, a chrominance channel and an associated key channel. To facilitate manufacture and maintenance of the digital video effects system it is advantageous for the hardware in each channel to be interchangeable. However standard television formats provide a full bandwidth luminance component of video and two half bandwidth chrominance components of the video which requires different processing for the luminance and chrominance components. Further, when pictures are transformed, it is necessary to obtain pixels between actual pixels stored in the frame store to provide smooth movement and continuity of the picture. Therefore, interpolation is required, and such interpolation requires access not just to one pixel from the frame store, but to neighboring pixels as well. What is desired is a picture transformation memory which provides identical frame stores for both full bandwidth signals and half bandwidth signals to allow interchangeability of the various frame stores within a digital video effects system, which provides a fully random accessible output of an addressed pixel together with its neighbors to an interpolator, and which allows manipulation of a full frame of data at apparent real time pixel rates.

SUMMARY OF THE INVENTION

Accordingly the present invention provides a picture transformation memory for a digital video effects system which has three field store memories, each field store having four planes and each plane having four banks. Digitized video data representing a picture image is input to the frame store on a field by field basis. As one field of the picture image is being written into one field store memory, the current field and the prior field are being read out of the other two field store memories to provide a complete frame of the picture image. Each plane of a field store memory contains the same field of picture video data for a full bandwidth component such as luminance and alternate planes contain the same field of picture video data for half bandwidth components such as chrominance video data, while each bank within the plane contains one-fourth of the field of picture video, the pixels of the picture video data being read sequentially into consecutive banks. For each pixel addressed for output four contiguous pixels, representing one field from one field store memory, or eight contiguous pixels, representing two fields from two of the field store memories, are output to an interpolator for processing. When a full bandwidth field store memory is accessed, the pixels are output at the pixel clock rate from consecutive planes of the memory. When a half bandwidth field store memory is accessed, the pixels are output at the pixel clock rate from consecutive planes of the memory, but the address is held the same for two clock cycles to access the two chrominance components. Thus it is the addressing rather than the hardware which differentiates between the full and half bandwidth channels.

The objects, advantages and novel features of the present invention will be apparent from the following

BRIEF DESCRIPTION OF THE DRAWING

FIG. 4 is a graphical illustration of the addressing of the field store of FIG. 3.

FIG. 5 is a graphical illustration of the addressing of two field stores representing a complete frame.

FIG. 7 is a graphical illustration of the storage of half bandwidth data in respective planes of the field store of FIG. 3.

DESCRIPTION OF THE PREFERRED EMBODIMENT

Figure 1:
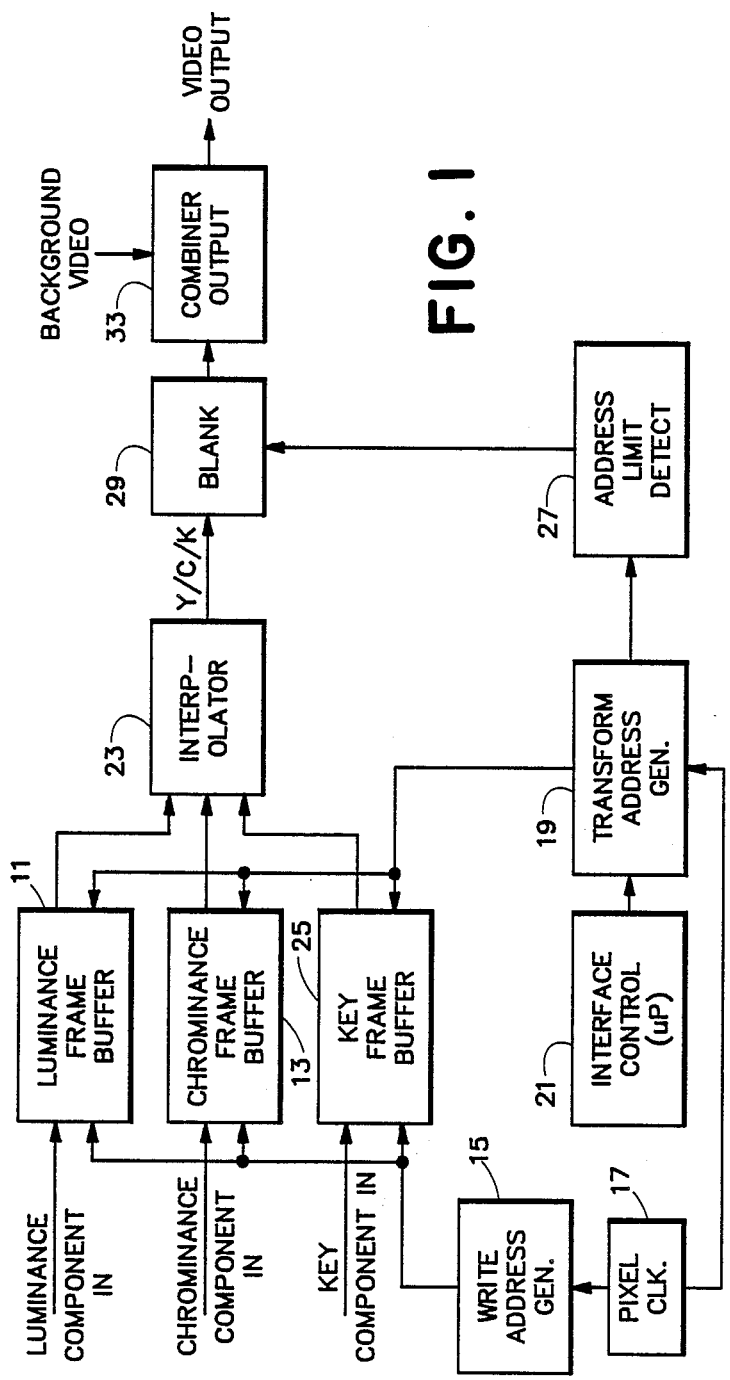
FIG. 1 is a block diagram view of a portion of a digital video effects system.

Referring now to FIG. 1 a portion of a digital video effects system incorporating the picture transformation memory of the present invention is shown. Video components of a picture image, such as a full bandwidth luminance component and two half bandwidth chrominance components according to a standard television digital format, are written into respective luminance and chrominance frame buffers 11, 13 under control of a write, or forward, address generator 15 which is clocked by a pixel clock 17. A corresponding full bandwidth key component is also written into a key frame buffer 25 under control of the write address generator. The picture image is read out of the respective frame buffers 11, 13, 25 under control of a read, reverse or transformation address generator 19 which is also clocked by the pixel clock 17. The sequence of addresses from the transformation address generator 19 is the product of sequential display addresses and a transform function T' determined by operator input via an interface controller 21. The output from the frame buffers 11, 13, 25 is a plurality of pixels related to the addressed pixel which are input to interpolator 23 to produce an intermediate pixel for smooth motion of the transformed picture. The address from the transformation address generator 19 is checked by an address limit detector 27 which inhibits via a blanking circuit 29 video outputs for invalid frame buffer addresses. The components are combined, or further processed, by a combiner circuit 33 and mixed with a background video signal according to the key signal, the key signal having undergone the same transformation as the picture image. The output of the combiner circuit 33 is the desired, transformed picture image for display.

Figure 2:
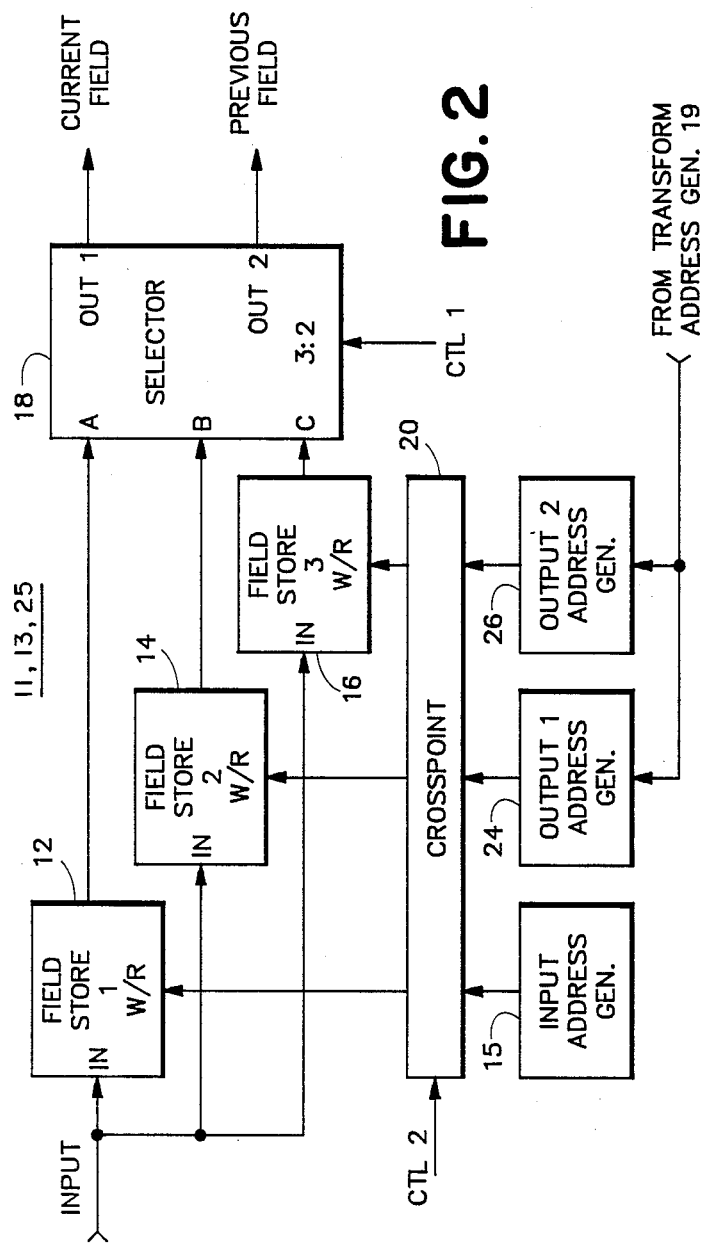
FIG. 2 is a block diagram view of one of the frame stores of FIG. 1 according to the present invention.

FIG. 2 shows one of the frame buffers 11, 13, 25 which uses three field store memories 12, 14, 16 on a rotating basis to provide an essentially deinterlaced frame of data at the output of a 3:2 selector 18. Digitized video data, either full bandwidth luminance data or half bandwidth chrominance data depending upon the frame buffer 11, 13, 25 to which the data is being input, is written into one of the three field store memories 12, 14, 16 as selected by a write signal from a crosspoint switching circuit 20 and the write address generator 15. As selected by read signals from the crosspoint switching circuit 20 and the output address generators 24, 26, the other two of the three field store memories 12, 14, 16 output data to the 3:2 selector 18 as determined by the addresses from the transformation address generator 19. A select signal CTL1 is applied to the 3:2 selector 18 to determine which of the three field stores contains current complete field data, which contains prior complete field data, and which is to be ignored for output. The output of the 3:2 selector 18 is two fields of data making up a full picture frame including the current complete field of data and the prior complete field of data.

For example at field time N field store one 12 is selected to receive the next field of digitized video from the input line, field store two 14 is selected to provide the prior complete field of data to the 3:2 selector 18, and field store three 16 is selected to provide the current complete field of data to the selector. At field time N+1 field store one now contains the current complete field of data for output to the selector 18, field store two is receiving a new field of data from the input line, and field store three contains the prior complete field of data for output to the selector. At field time N+2 field store one contains the prior complete field of data for output to the selector, field store two contains the current complete field of data for output to the selector, and field store three is receiving a new field of data from the input line. At time N+4 the cycle is started over again with field store one receiving a new field of data from the input line. In this way the output of selector 18 provides the most recent complete frame of data for further processing by the digital video effects system.

Figure 3:
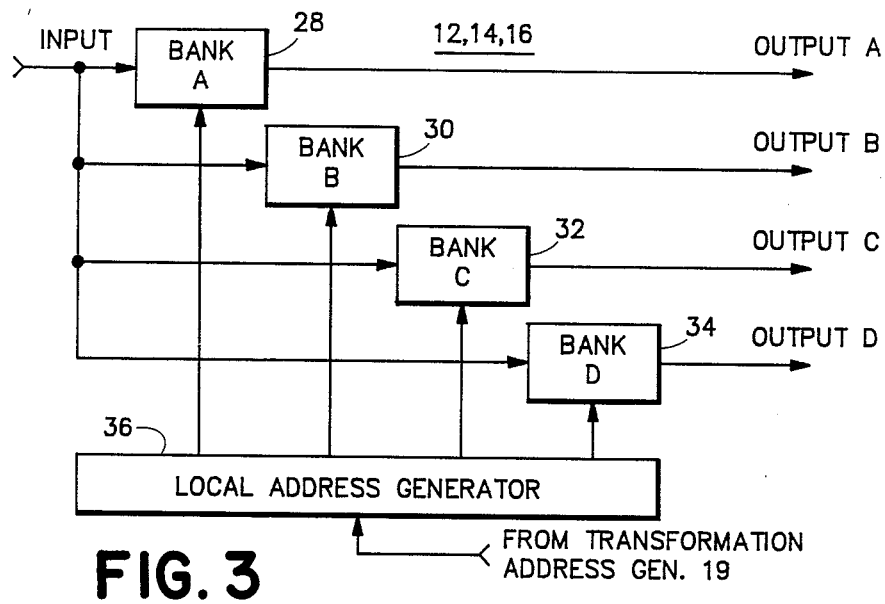
FIG. 3 is a block diagram view of one of the field stores making up the frame store of FIG. 2.
Figure 6:
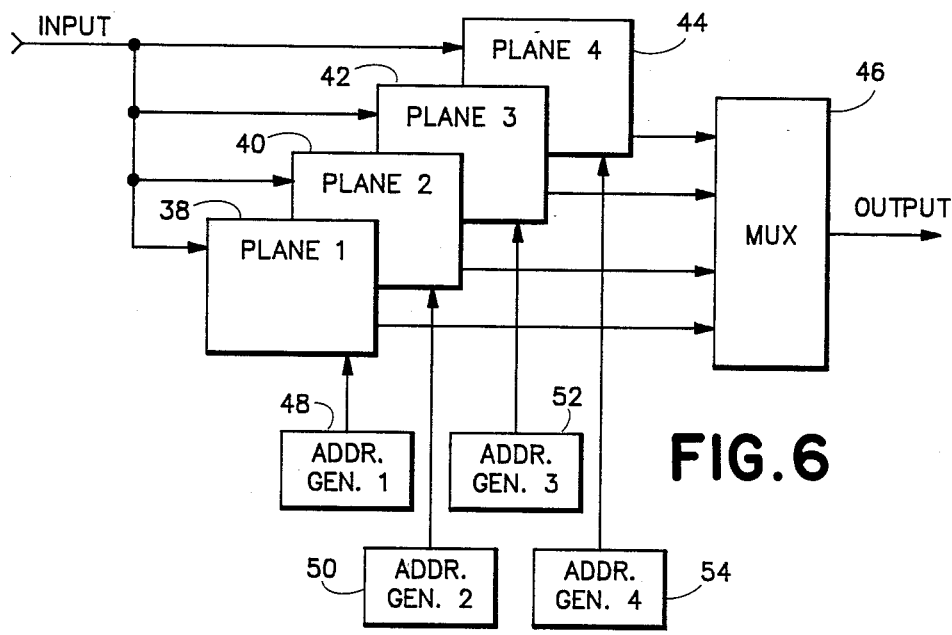
FIG. 6 is a block diagram view of one of the banks making up the field store of FIG. 3.

Each field store 12, 14, 16 has four identical banks of memory 28, 30, 32, 34 as shown in FIG. 3. The total memory capacity of the four banks is sufficient to contain one complete field of video data. The field of video data is stored in such a manner in the banks 28, 30, 32, 34 that for any pixel addressed, the three nearest neighbors are stored one each in the remaining banks as shown in FIG. 4. If data is written into the field store horizontally, the pixels are stored in bank order A,C,A,C,A,C etc. on the even lines and B,D,B,D,B,D etc. on the odd lines. If data is written vertically, the pixels are stored in the bank order A,B,C,D,A,B,C,D etc. on the even columns and C,D,A,B,C,D,A,B etc on the odd columns. When data is read from the field store, the picture transformation address generator 19 points at the upper left corner of a desired set of four pixels to be accessed. A local address generator 36 determines what address to access in each of the four banks 28, 30, 32, 34. If the address of the upper left pixel selected by the picture transformation address generator is "n", then the other pixel addresses generated by the local address generator 36 are calculated as follows:

Upper left pixel=n
Upper right pixel=n+1 column
Lower left pixel=n+1 row
Lower right pixel=n+1 row+1 column It can be seen from FIG. 4 that the two least significant bits of the row address signal, which are labeled Y0 and Y1, and the least significant bit of the column address signal, which is labeled X0, from the picture transformation address generator can be used to determine the bank orientation of the desired pixel quad.

FIG. 5 shows this concept extended to a complete two field frame by using two field stores, each organized into four banks as described above and using the three least significant bits of RAS. The local address generator 36 translates the frame addresses from the picture transformation address generator into field addresses as follows:

Field 1 Address=(Frame Address)/2
Field 2 Address=(Frame Address+1)/2

These addresses are used as described above to provide eight simultaneous pixels, two horizontally and four vertically, which an interpolator can use to perform a higher order vertical interpolation if required. Such an interpolator is described in co-pending U.S. patent application No. 922,601 entitled Interpolator for Television Special Effects System by John Abt and Richard A. Jackson, filed Oct. 23, 1987.

Besides being composed of four banks 28, 30, 32, 34 each field store 12, 14, 16 is also composed of four identical planes 38, 40, 42, 44. Each plane is divided between the four banks and thus has sufficient memory capacity to contain one complete field of video data, and each plane is uniquely addressable. Each plane 38, 40, 42, 44 has its own address generator 48, 50, 52, 54. An output multiplexer 46 selects one of the four memory planes in sequence to provide the output.

When data is written into each field store 12, 14, 16, all four planes are addressed identically which results in storing the same complete field of video picture data in the banks duplicated in all planes. When the picture is read from the field store 12, 14, 16, the first pixel addressed is accessed from the appropriate bank of plane one 38. While the first plane 38 is accessing the first pixel together with the neighboring pixels as described above, the second pixel is being requested from plane two 40. Likewise while the first and second planes 38, 40 are accessing their respective pixels, the third pixel is being requested from the appropriate bank of plane three 42. Finally plane four 44 is accessed in the same manner, completing the cycle. The fifth pixel is again requested from plane one 38. Thus the memory access time only needs to be one-fourth the required pixel rate.

The output multiplexer 46 is synchronized with the data available at the output from each plane 38, 40, 42, 44. Therefore the output of the multiplexer 46 is a continuous stream of pixels transparent to the fact that each came from a different memory plane. This independently addressable scheme provides for a totally random access of pixels. For example the upper left pixel of a stored picture may be followed by the lower right pixel followed in turn by the center pixel or any other combination desired.

When writing data into the field stores 12, 14, 16 in the full bandwidth mode, all four planes 38, 40, 42, 44 are addressed identically which results in storing the same picture, or video field, in all four planes as described above. In the half bandwidth mode the same hardware is used with the exception that two half bandwidth signals, such as the U and V chrominance components, are multiplexed into the same input. The first pixel ($U=R-Y$) is written into the first plane, the second pixel ($V=B-Y$) is written into the second plane at the same address as the first U pixel as shown in FIG. 7. This continues as with the full bandwidth case such that all the U pixels are stored in planes one and three, and all the V pixels are stored in planes two and four at the same address location as their corresponding U pixels, with planes one and three having identical U data and planes two and four having identical V data. Thus only half of the memory space of the four planes is used.

Figure 8:
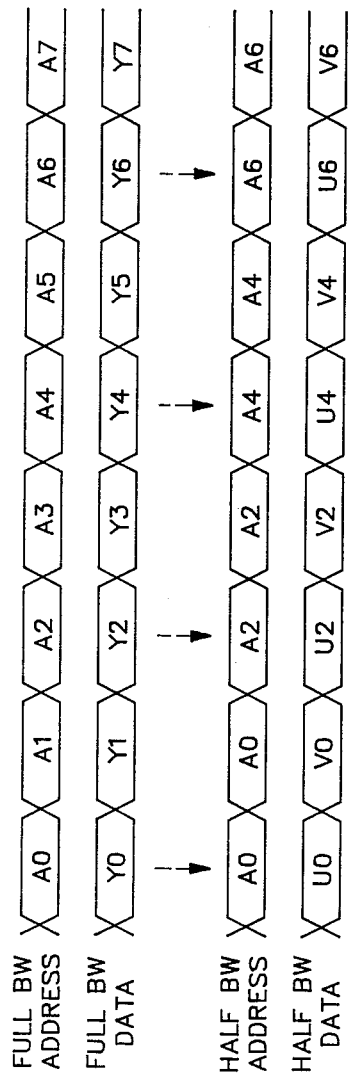
FIG. 8 is a graphical illustration of the output of full bandwidth and half bandwidth data from the planes of FIG. 6 for consecutive pixels.
Figure 9:
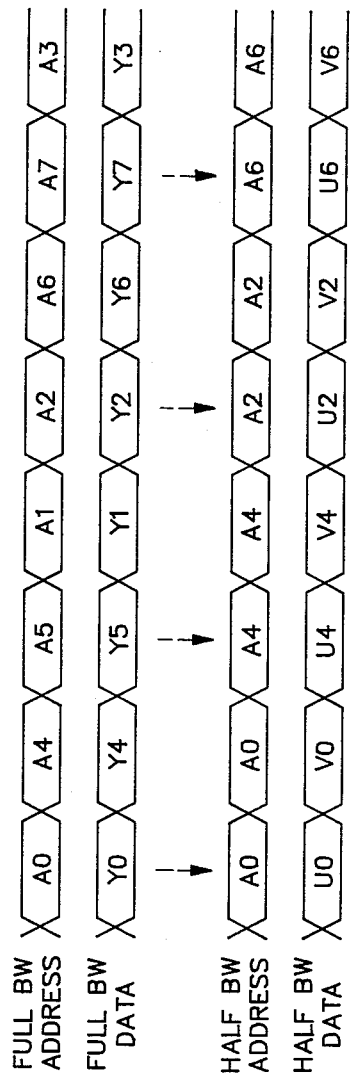
FIG. 9 is a graphical illustration of the output of full bandwidth and half bandwidth data from the planes of FIG. 6 for non-consecutive pixels.

When the picture is read from the field store, the first pixel requested is accessed from plane one 38 having U data. The address is then held while the corresponding V pixel is accessed from the same address of plane two 40. Similarly the second pixel of U data is accessed from plane three 42 and the corresponding V pixel is accessed from plane four 44. As with the full bandwidth case, the access upon reading from the field store is totally random. If the first pixel is read from address 1 (full bandwidth), the half bandwidth memory ignores the least significant bit and accesses U data from address 0 in plane one 38 followed on the next clock cycle by address 0 in plane two 40 for the corresponding V pixel. FIG. 8 illustrates this reading process for an untransformed picture, i.e., the same picture is output as was input, while FIG. 9 illustrates the reading process for a transformed picture randomly accessed.

Thus the present invention provides a totally randomly accessible picture transformation memory which provides smooth picture continuity and identical hardware for both full and half bandwidth video picture components by using a three field frame store with each field having four planes and each plane having four banks, the output of the banks providing an addressed and neighboring pixels for input to an interpolator and the addressing of the planes determining whether full or half bandwidth data is being read.

What is claimed is:

1. A picture transformation memory of the type having three field stores making up a frame store such that one field store is being written into while the other two are being read out to provide a full frame video output comprising:
    a plurality of banks making up each field store, the banks for each field store having a total capacity to store one complete field of input digitized video data; and
    means for accessing in parallel the video data stored in the plurality of banks such that, when a given pixel of the video data is requested for access, neighboring pixels from each bank are automatically accessed to produce a multi-pixel output for input to an interpolator.

2. A picture transformation memory as recited in claim 1 wherein the video data is stored pixel by pixel in one of the banks such that for any given pixel its nearest neighbors are contained one each in the remaining banks.

3. A picture transformation memory as recited in claim 2 wherein the accessing means comprises means for accessing two field stores simultaneously when the given pixel is requested to produce two multi-pixel outputs for input to the interpolator.

4. A picture transformation memory as recited in claim 1 wherein each field store further comprises:
    a plurality of planes, each plane having a capacity to store a full field of the digitized video data representing a picture and being divided into the plurality of banks such that each plane contains the picture;
    means for addressing each plane independently of the other planes depending upon a desired transformation of the picture; and
    means for multiplexing the outputs of the planes sequentially to produce an output field of video data which is transparent of the fact that each pixel that makes up the output field comes from a different one of the planes.

5. A picture transformation memory as recited in claim 4 wherein the plurality of planes contain half bandwidth data comprising two components of the video data, the pixels making up the two components being stored in alternate planes with corresponding pixels of the two components being stored in corresponding addresses of consecutive planes.

6. A picture transformation memory as recited in claim 5 wherein the addressing means comprises:

means for randomly accessing any pixel of full bandwidth data contained in one of the field stores; and means for accessing the corresponding half bandwidth data components by using a truncated address word for accessing consecutive planes, the truncated address word being derived from a multi-bit address word produced by the randomly accessing means for the full bandwidth data by dropping the least significant bit of the multi-bit address word.

* * * * *